United States Patent [19]
Kay

[11] Patent Number: 5,987,240
[45] Date of Patent: Nov. 16, 1999

[54] DESIGN RULES CHECKER FOR AN INTEGRATED CIRCUIT DESIGN

[75] Inventor: Rony Kay, Pittsburgh, Pa.

[73] Assignee: International Business Machines Corporation, Armonk, N.Y.

[21] Appl. No.: 08/886,031

[22] Filed: Jun. 30, 1997

[30] Foreign Application Priority Data

Oct. 29, 1996 [EP] European Pat. Off. ............. 96480101

[51] Int. Cl.⁶ .................................................. G06F 17/50
[52] U.S. Cl. ....................................................... 395/500.06
[58] Field of Search ................................... 364/488, 489, 364/490, 491, 578; 395/500.06, 500.05, 500.03

[56] References Cited

U.S. PATENT DOCUMENTS

| | | | |
|---|---|---|---|
| 5,050,091 | 9/1991 | Rubin | 364/488 |
| 5,473,546 | 12/1995 | Filseth | 364/489 |
| 5,528,508 | 6/1996 | Russell et al. | 364/488 |
| 5,559,718 | 9/1996 | Baisuck et al. | 364/491 |
| 5,831,869 | 11/1998 | Ellis et al. | 364/490 |
| 5,870,308 | 2/1999 | Dangelo et al. | 364/489 |

OTHER PUBLICATIONS

T. G. Szymanski, et al., "Goalie: A Space Efficient System for VLSI Artwork Analysis" IEEE Design & Test of Computers, V. 2, # 3, pp. 64–72, 1985.

H. Modarres, et al., "A Formal Approach to Design–Rule Checking" IEEE Transactions on Computer Aided Design, V. CAD–6, # 4, pp. 561–572 Jul. 1987.

D. Marple, et al., "Tailor: A Layout System Based on Trapezoidal Corner Stitching" IEEE Transactions on Computer–Aided Design, V. 9, # 1, pp. 66–89,Jan. 1990.

N. Hedenstierna, et al., "The Halo Algorithm—An Algorithm for Hierarchical Design of Rule Checking of VLSI Circuits" IEEE Transactions on Computer–Aided Design of Integrated Circuits and Systems, V.12, # 2, pp. 265–272, Feb. 1993.

*Primary Examiner*—Eric W. Stamber
*Assistant Examiner*—Leigh Marie Garbowski
*Attorney, Agent, or Firm*—H. Daniel Schnurmann

[57] ABSTRACT

A design rule checker for verifying that an integrated circuit design meets one or more geometrical constraints, the integrated circuit design being expressed as a graph data structure having at least a root node connected by a plurality of paths to one or more leaf nodes so that a single leaf node can represent multiple instances of a geometrical shape. In the preferred embodiment, the design rule checker includes: means for generating a flattened graph data structure in which each instance of the primitive geometrical shape is separately represented; means for scanning the flattened data structure to generate an error report comprising a plurality of error records representing violations of a geometrical constraint by a geometrical shape, wherein each error record includes a sortable index representing the path in the graph data structure from a root node to the geometrical shape giving rise to an error; and means for sorting the error report and for identifying the error records according to the sortable indices representing the paths through the graph data structure.

12 Claims, 3 Drawing Sheets

DESIGN RULES CHECKER FOR AN INTEGRATED CIRCUIT DESIGN

FIELD OF THE INVENTION

This invention relates to integrated circuit design automation tools and, more particularly, to a design rules checker for verifying that an integrated circuit design meets one or more geometrical constraints.

BACKGROUND OF THE INVENTION

Present day integrated circuits (IC) are designed using a variety of software tools, known in the art as Design Automation tools. These tools encompass data entry capture, simulation, partitioning of logic, synthesis, wiring and placement, testing, etc. One of the tools which are deemed essential to the design of any IC product, whether a chip, module, card, board, frame, and the like, is known as a ground rules checker. Ground rules checking is the process of verifying that a mask layout of an integrated circuit does not violate a set of predefined geometrical design rules, also referred to as ground rules. These rules are, typically, determined by the manufacturing process (also known as the plan of record) used to fabricate the integrated circuit. Ground rules are thus a collection of geometrical constraints among geometrical shapes that define the layout of an IC. It is presumed that a circuit design which obeys the ground rules for a particular process should be manufacturable when using that process. Accordingly, ground rules checking is an essential step in any IC design process.

IC designs are generally expressed as a geometrical description of the layout organized hierarchically in a data file. Consequently, an error within the hierarchy may give rise to many violations of the ground rules throughout the design, and which because of the hierarchy, oftentimes, represent the same error replicated many times. If this is realized, particularly, during early stages of the design phase, it may be possible for the designer to intervene only once in the hierarchy in order to rectify the error.

Known ground rules checkers can be divided into two classes according to the algorithmic approach and internal architecture: (i) Flat ground rules checkers which treat each polygon on a flattened layout as an independent entity, and (ii) Hierarchical checkers, which exploit the hierarchy to direct the traversal of the data.

An example of a flat ground rules checker can be found in IEEE Design and Test of Computers, Vol 2, No. 3, pp. 64–72 (1985).

Examples of hierarchical ground rules checkers can be found in IEEE Transactions on Computer Aided Design of Integrated Circuits and Systems, Vol CAD-6, No. 4, pp. 561–573 (1987), Vol 9, No. 1, pp. 66–90 (1990) and Vol 12, No. 2 pp. 265–272 (1993).

Flat ground rules checkers report all the instances of an error without regard of the source of the error. Its main disadvantage resides in that the report contains much redundant and irrelevant information and that the amount of work required to rectify the error is not apparent from the report. Hierarchical checkers, on the other hand, are complicated to implement and less efficient for structures which are not highly nested or well structured.

SUMMARY OF THE INVENTION

It is, therefore, an object of the present invention to provide an improved ground rules checker.

More particularly, it is one aspect of the present invention to provide a design rule checker that verifies that an integrated circuit design meets one or more geometrical constraints. The integrated circuit design is expressed as a graph data structure having at least a root node connected by a plurality of paths to one or more leaf nodes so that a single leaf node can represent multiple instances of a geometrical shape. The design rule checker includes the steps of: verifying that an integrated circuit design meets one or more geometrical constraints, for use in a integrated circuit design tool in which an integrated circuit design is expressed as a graph data structure having at least a root node connected by a plurality of paths to one or more leaf nodes, the single leaf node representing a multiple instances of a geometrical shape, the method comprising the steps of: generating a flattened data structure in which each instance of said primitive geometrical shape is separately represented; scanning the flattened data structure to generate an error report comprising a plurality of error records representing violations of a geometrical constraint by a geometrical shape, wherein each error record comprises a sortable index representing the path in the graph data structure extending from a root node to the geometrical shape giving rise to the error; and sorting the error report to identify the error records according to the sortable indices representing the paths through the graph data structure.

In at least one preferred embodiment, each error record is augmented with additional fields which include information derived from the hierarchy of the layout design. The error records can be sorted so that all the records that relate to the same error within the hierarchy are grouped together within the sorted arrangement. In this way, a flat error checker is improved so that multiple instances of the same error can be recognized and reported.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT

In the preferred embodiment, the design rule checker is implemented in the form of a general purpose computer workstation of conventional type which operates under the control of suitable programs to carry out the various design tasks described herein. By way of example, the computer could be an IBM RISC SYSTEM/6000 (IBM and RISC SYSTEM/6000 are Trademarks of International Business Machines Corporation). It will be understood, however, that the invention may equally be implemented in the form of hardware using specially designed circuits or using any combination of special or general purpose hardware or software.

Figure 1:
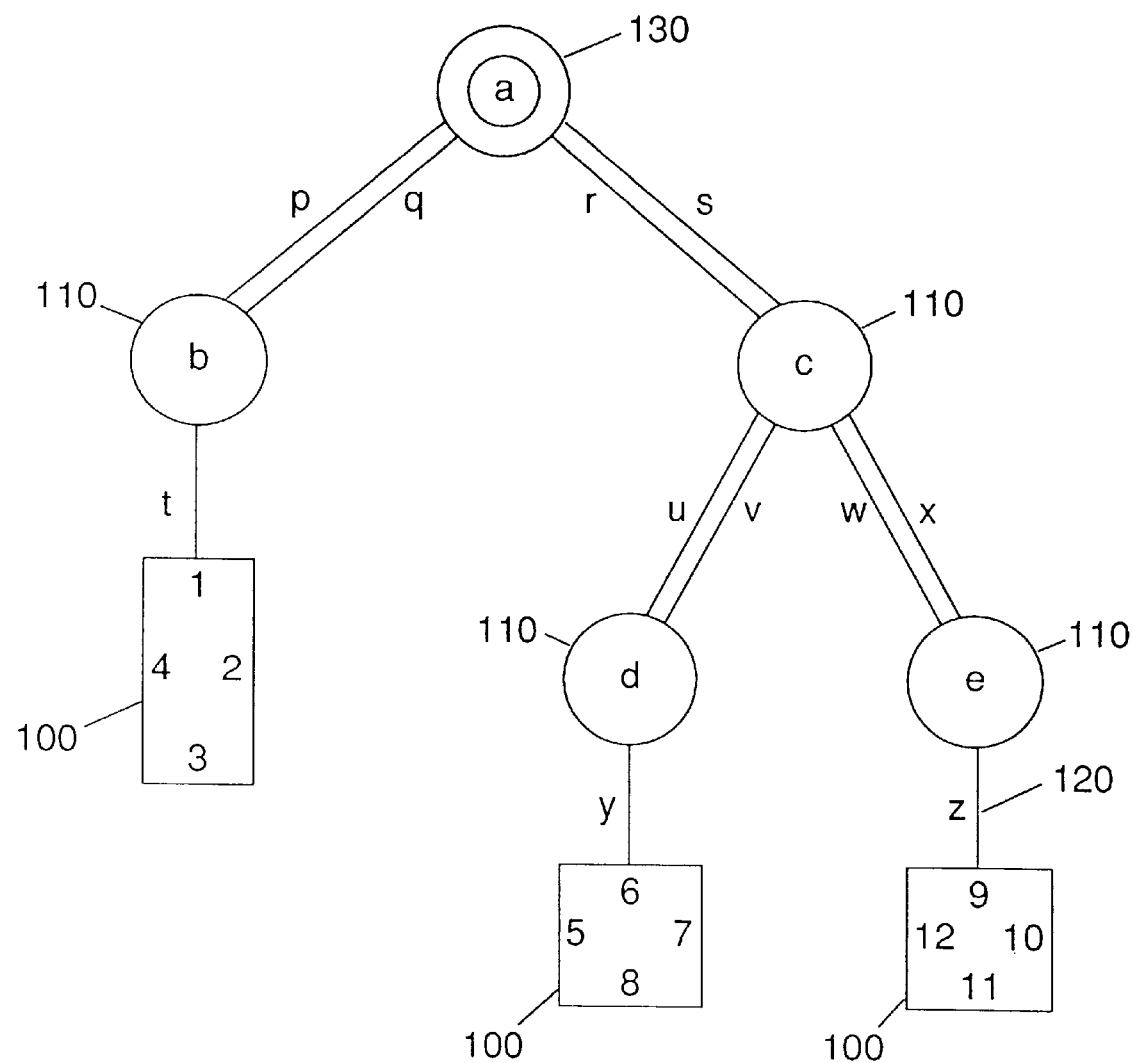
FIG. 1 is a schematic representation of a prior art Direct Acyclic Graph.

It is conventional in the art to store an integrated circuit design in a computer storage in the form of a Directed Acyclic Graph (DAG). FIG. 1 shows a schematic representation of such a data structure. The details of the pointers and the like which are required to set up such a structure within the computer, are well understood by those skilled in the art, and need not be described in detail here.

A DAG contains two types of nodes representing cells and shapes, respectively. A shape is a geometrical entity which belongs to a specific layer in the design, for example, a rectangle or a polygon of a particular size on the diffusion layer. Within DAG, a shape is represented by a leaf node 100, i.e., a node with no descendants. A cell is a design entity which, typically, includes various shapes and other types of cells. A cell is, characteristically, represented by intermediate nodes 110, which can have descendants, and which can be either shapes or other cells. Within DAG, directed edges, such as edge 120, can connect a cell either to another cell or to a shape. Each edge is associated with a geometric transform, such as a rotation, translation, mirroring, and the like. The mask layout can be calculated from DAG by a first in depth search traversal starting at the root node 130. The root node 130 is also sometimes referred to in the art as a prime cell.

The geometrical location of a particular shape is obtained by superposing the transforms along a single path from the root node to a leaf node. More than one path can lead to a shape, in which case, there is more than one instance of a shape in the layout, the number of instances being equal to the number of paths from the root node to the shape node.

Practitioners in the art will readily recognize that this is only a simplified description of a layout representation which presents the details required for an understanding of the present invention.

Each polygon edge within DAG is assigned a unique edge ID, numbered 1 to 12, as shown in FIG. 1. Clearly, an edge ID may correspond to more than one edge in the layout. Each transform, i.e., each directed edge, is assigned a transform ID, shown in FIG. 1 as letters p to z. Finally, each cell is assigned a unique cell ID, shown as letters a–e, as illustrated in FIG. 1.

Figure 2:
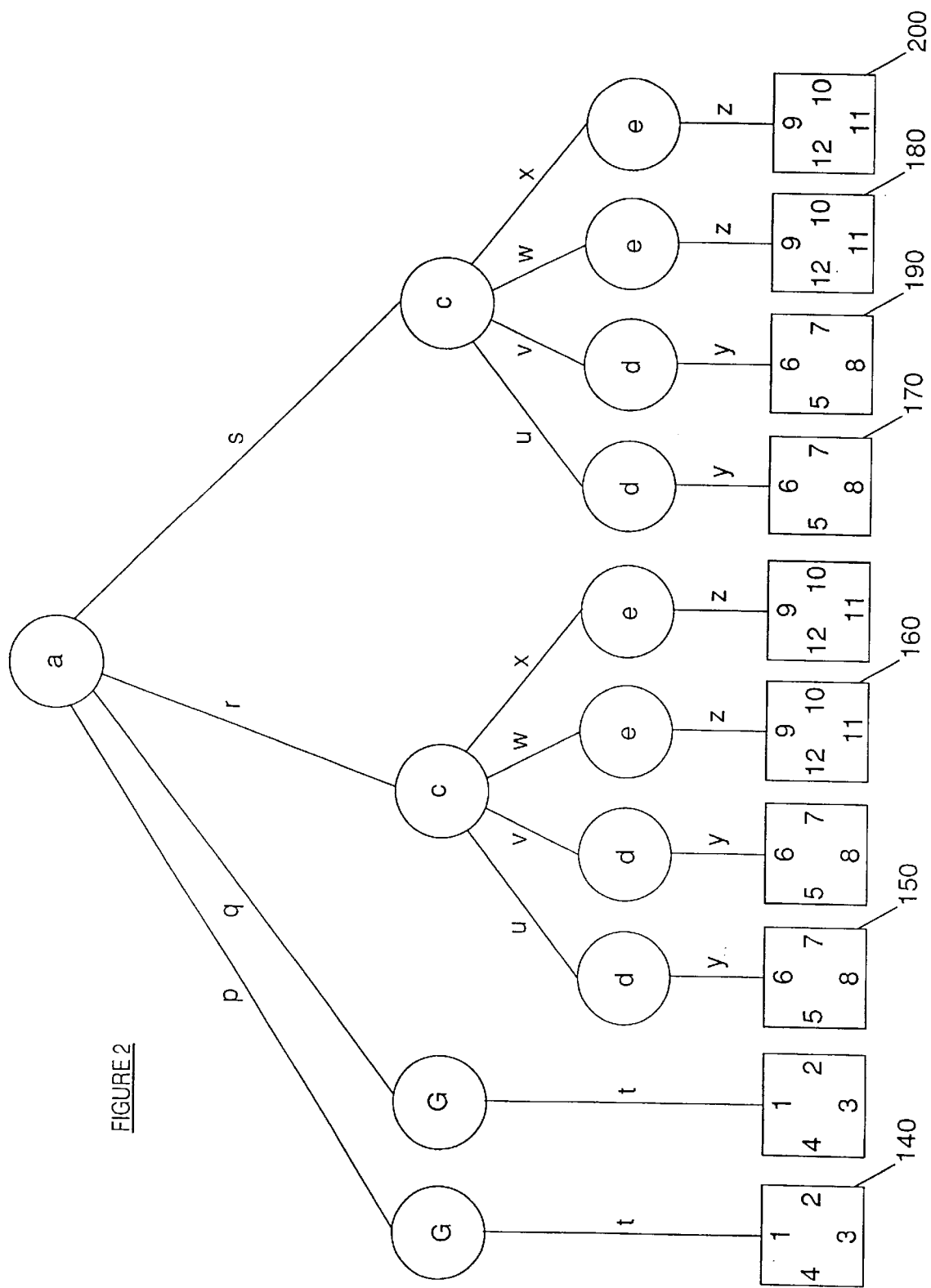
FIG. 2 shows a flattened view of the graph of FIG. 1.

FIG. 2 shows the flattened view of the DAG version shown in FIG. 1.

Figure 3:
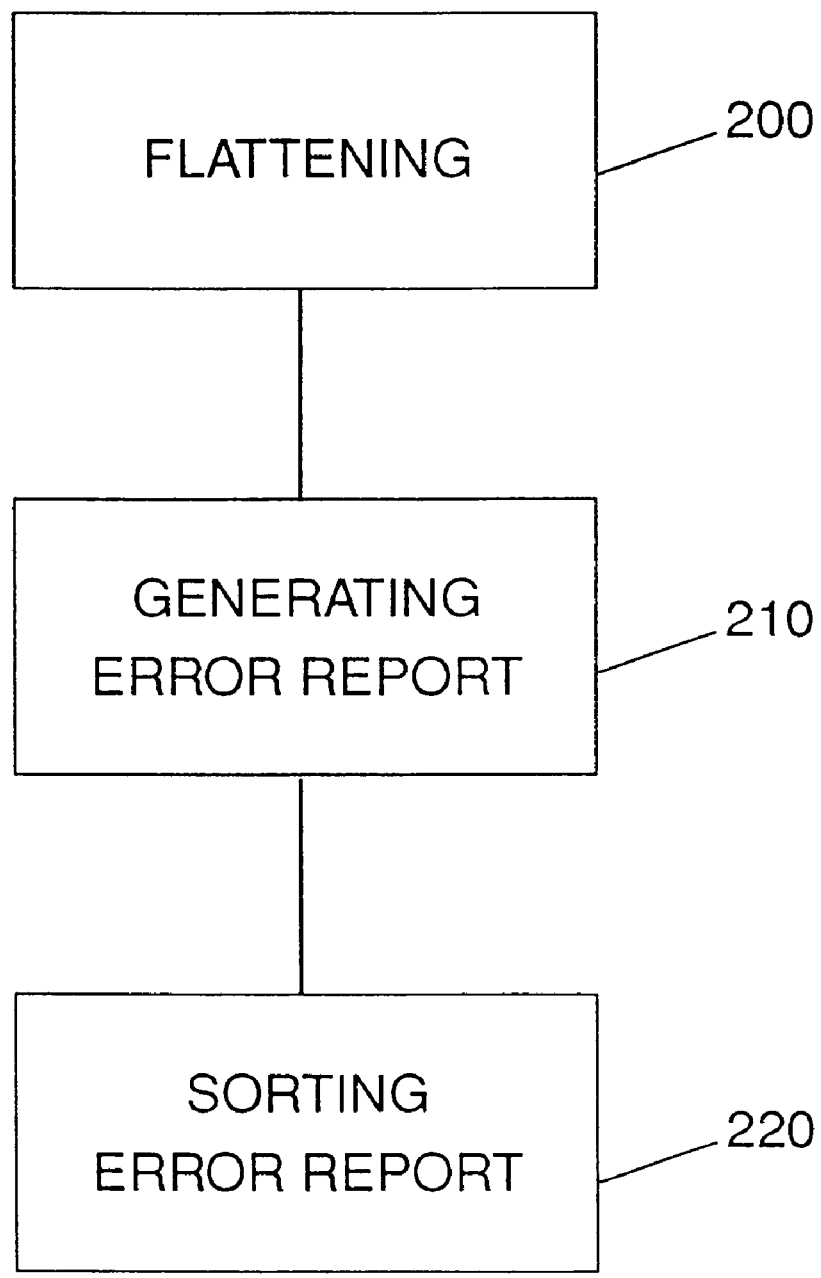
FIG. 3 is a flow diagram showing the main steps of a checking process in accordance with the present invention.

FIG. 3 is a flow diagram showing the main steps of the checking process. First, DAG is flattened in step 200 to form a flattened data structure, wherein each instance of a shape is represented separately. This flattened representation is traversed in step 210 by the design rules checker to generate a flat error report. The flat error report is a list of records that includes an error type and the geometry of the edges causing the error. The operation of the design rules checker is, in this respect, conventional and need not be described herein in more detail. The conventional flat error report is augmented with two additional fields per edge: (i) the edge ID, and (ii) a path vector which comprises the transform ID, and the cell IDs on the path from the root node to the shape node. By way of example, the edge shown indicated by numeral 140 in FIG. 2 has the path vector apbt and edge ID 2.

The list of augmented error records is sorted or filtered in step 220 in the following manner.

Within each error record, the edge with the smallest edge ID will be referred hereinafter as the first edge, the edge with the second smallest edge ID as the second edge, and so forth. For each error, the path vectors for the edges causing the error are compared and the path vectors truncated by removing any common prefix. For example, if an error record contained edge arcudy-7, referred to by numeral 150, and edge arcwez-12, referred to by numeral 160, these would be truncated by removing the prefix arc- and leaving udy-7 and wez-12. The remaining part of the path vector will be referred hereinafter as the tail of the path vector.

The list of error records is then sorted lexicographically according the fields as follows:

1. Error type;
2. Edge ID of the first edge;
3. Edge ID of the second edge;
4. The tail of the path vector of the first edge; and
5. The tail of the path vector of the second edge.

It will be understood by those skilled in the art that this sorting order may be extended for errors caused by more than two edges.

Once the list of error records has been sorted in this way, errors which are duplications caused by the hierarchy will be grouped together since, once the prefixes common to path vectors within the error records are removed, the path vectors of the edges causing duplicated errors, i.e., errors in different error records but which have the same cause, will have the same tails.

Accordingly, in the above example, if a second error record contains edges ascudy-7, referred to by numeral 170, and ascwez-12, referred to by numeral 180, then this error record would be grouped with the first in the sorted report since once the prefix asc- is removed path vectors of the edges in the error records have the same tails. On the other hand, if a third error record contains edges ascvdy-7, referred to by numeral 190, and ascxez-12, referred to by numeral 200, then this error record would not be grouped with the other two, since once the common prefix asc- is removed, the path vectors for the edges causing the error do not have the same tails. This error is, therefore, distinct from the other two and is not a duplication.

It will be understood that the sorted error report may be presented to the user in a variety of different ways, for instance, using color or other means of decorating the report, so that error records having the same tails can be readily identified by a user.

As described above, the present implementation takes the form of a computer program and can be distributed in the form of a program product comprising a computer usable medium in which suitable program code is embodied for causing a computer to perform the function of the design tool described above.

The present implementation takes further the form of a program storage device readable by a machine, tangibly embodying a program of instructions executable by the machine to perform a sequence of method steps that cause the program storage device perform the function of the design tool described above.

The tool can take the form of a 'stand-alone' system or can be integrated together with other functions as part of Design Automation set of tools used in the design of any IC.

While the invention has been described in terms of preferred embodiments, those skilled in the art will recognize that the invention can be practiced with modification within the spirit and scope of the appended claims.

Having thus described our invention, what I claim as new and desire to secure by Letters Patent is as follows:

1. A design rule checker for verifying that an integrated circuit design meets a plurality of geometrical constraints, the integrated circuit design being expressed as a graph data structure having at least a root node connected by a plurality of paths to at least one leaf node, the leaf node representing multiple instances of a geometrical shape, the design rule checker comprising:

means for flattening the graph data structure, wherein each instance of the geometrical shape is represented separately;

means for scanning the flattened graph data structure to generate an error report comprising a plurality of error records, each of the records representing a violation of at least one of the geometrical constraints, each of the error records including a sortable index representing the path in the graph data structure extending from the root node to the geometric shape giving rise to the violation; and means for sorting the error report and for identifying the error records according to the sortable indices representing the paths through the graph data structure.

2. The checker as claimed in claim 1, wherein the error records group together the sortable indices representing the paths through the graph data structure.

3. The checker as claimed in claim 1, wherein the sortable index comprises a path vector, and wherein the sorting means removes from the path vector a first portion representing a path within the graph data structure common to edges within the error records, and the sorting means further sorts the error records according to a second portion of the path vectors of the edges making up the error records.

4. A method for verifying that an integrated circuit design meets one or more geometrical constraints, the integrated circuit design being expressed as a graph data structure having at least a root node connected by a plurality of paths to one or more leaf nodes, the leaf node representing multiple instances of a geometrical shape, the method comprising the steps of:

generating a flattened graph data structure in which each instance of said primitive geometrical shape is separately represented;

scanning the flattened graph data structure to generate an error report comprising a plurality of error records, each of the error records representing violations of at least one of the geometrical constraints by one of the geometrical shapes, wherein each of the error records includes a sortable index representing the path in the graph data structure extending from the root node to the geometrical shape giving rise to the violation; and sorting the error report to identify the error records according to the sortable indices representing the paths through the graph data structure.

5. The method as recited in the step of sorting the error report of claim 4, further comprising the step of grouping together the error records according to the sortable indices that represent the paths through the graph data structure.

6. The method as recited in claim 4, wherein the sortable index comprises a path vector, and wherein the sorting step further comprises removing from the path vector a first portion representing a path within the graph data structure common to edges within the error records, and sorting the error record according to a second portion of the path vectors of the edges making up the error records.

7. A computer program product comprising:

a computer usable medium having computer readable program code means embodied therein for causing a computer perform the function of a design rule checker for verifying that an integrated circuit design meets one or more geometrical constraints, the integrated circuit design being expressed as a graph data structure having at least a root node connected by a plurality of paths to at least one leaf node so that one of said at least one leaf node represents multiple instances of a geometrical shape, the program product comprising:

computer readable program code means for causing the computer to generate a flattened graph data structure in which each instance of said primitive geometrical shape is separately represented; computer readable program code means for causing the computer to scan the flattened graph data structure to generate an error report comprising a plurality of error records representing violations of at least one of said geometrical constraints by said geometrical shape, wherein each of the error records comprises an index representing the path in the graph data structure from a root node to the geometrical shape giving rise to the violation; and computer readable program code means for causing the computer to sort the error report and to identify the error records according to the sortable indices representing the paths through the graph data structure.

8. The computer program product as claimed in claim 7, wherein the computer readable program code means groups together the error records according to the sortable indices that represent the paths through the graph data structure.

9. The computer program product as claimed in claim 7, in which the index comprises a path vector, wherein logic is sorted so as to remove from the path vector a first portion representing a path within the graph data structure common to edges within the error records, and the error records are sorted according to a second portion of the path vectors of the edges making up the error records.

10. A program storage device readable by a machine, tangibly embodying a program of instructions executable by the machine to perform method steps for causing a design rule checker to verify that an integrated circuit design meets one or more geometrical constraints, the integrated circuit design being expressed as a graph data structure having at least a root node connected by a plurality of paths to at least one leaf node so that one of the at least one leaf nodes represents multiple instances of a geometrical shape, the program comprising the steps of:

generating a flattened graph data structure in which each instance of said primitive geometrical shape is separately represented;

scanning the flattened graph data structure to generate an error report comprising a plurality of error records representing violations of a geometrical constraint by the geometrical shape, wherein each of the error records comprises a sortable index representing the path in the graph data structure from a root node to the geometrical shape giving rise to the violation; and sorting the error report and identifying the error records according to the sortable indices representing the paths through the graph data structure.

11. The program storage device as recited in the step of sorting the error report of claim 10, further comprising the step of grouping together the error records according to the sortable indices that represent the paths through the graph data structure.

12. The program storage device as claimed in claim 10, wherein the sortable index comprises a path vector, and wherein the step of sorting comprises removing from the path vector a first portion representing a path within the graph data structure common to edges within the error records and sorting error records according to a second portion of the path vectors of the edges making up the error records.

* * * * *